United States Patent
Xu et al.

(10) Patent No.: US 9,093,414 B2
(45) Date of Patent: Jul. 28, 2015

(54) BATTERY HEATING CIRCUITS AND METHODS BASED ON BATTERY DISCHARGING AND CHARGING USING RESONANCE COMPONENTS IN SERIES AND MULTIPLE CHARGE STORAGE COMPONENTS

(75) Inventors: Wenhui Xu, Shenzhen (CN); Yaochuan Han, Shenzhen (CN); Wei Feng, Shenzhen (CN); Qinyao Yang, Shenzhen (CN); Wenjin Xia, Shenzhen (CN); Shibin Ma, Shenzhen (CN); Xianyin Li, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 891 days.

(21) Appl. No.: 13/184,915

(22) Filed: Jul. 18, 2011

(65) Prior Publication Data

US 2012/0025781 A1    Feb. 2, 2012

(30) Foreign Application Priority Data

Jul. 30, 2010  (CN) .......................... 2010 1 0245288
Aug. 30, 2010  (CN) .......................... 2010 1 0274785
Mar. 31, 2011  (CN) .......................... 2011 1 0081276

(51) Int. Cl.
*H02J 7/00*        (2006.01)
*H01L 23/34*       (2006.01)
(Continued)

(52) U.S. Cl.
CPC ......... *H01L 23/345* (2013.01); *H01M 10/5006* (2013.01); *H01M 10/5016* (2013.01);
(Continued)

(58) Field of Classification Search
USPC ................................ 320/128, 139, 150, 153
See application file for complete search history.

(56) References Cited

U.S. PATENT DOCUMENTS

| 3,654,426 A | 4/1972 | Brinkmann et al. |
| 3,808,481 A | 4/1974 | Rippel |

(Continued)

FOREIGN PATENT DOCUMENTS

| CN | 1630129 A | 6/2005 |
| CN | 1630130 A | 6/2005 |

(Continued)

OTHER PUBLICATIONS

China Patent Office, Office Action dated Sep. 21, 2011, in related application CN 201010603658.3.

(Continued)

*Primary Examiner* — Drew A Dunn
*Assistant Examiner* — Zixuan Zhou
(74) *Attorney, Agent, or Firm* — Jones Day

(57) ABSTRACT

Under one aspect, a heating circuit for a battery includes a plurality of switch units, a switching control module, a damping component, an energy storage circuit, and a polarity inversion unit. The energy storage circuit is connected with the battery, and includes a current storage component and a plurality of charge storage components that respectively are connected with the plurality of switch units in series to form a plurality of branches that are connected in parallel with each other and in series with the current storage and damping components. The switching control module controls switching on and off of the switch units, so that energy flows back-and-forth between the battery and the energy storage circuit when the switch units switch on. The polarity inversion unit is connected with the energy storage circuit inverts a voltage polarity of the plurality of charge storage components after the switch units switch off.

12 Claims, 8 Drawing Sheets

(51) Int. Cl.
  *H01M 10/615* (2014.01)
  *H01M 10/625* (2014.01)
  *H01M 10/657* (2014.01)
  *H01M 10/6571* (2014.01)
  *H02M 3/158* (2006.01)

(52) U.S. Cl.
  CPC ...... *H01M10/5081* (2013.01); *H01M 10/5083* (2013.01); *H02J 7/0054* (2013.01); *H01L 2924/0002* (2013.01); *H02J 7/0014* (2013.01); *H02J 7/0075* (2013.01); *H02J 7/0091* (2013.01); *H02J 7/0093* (2013.01); *H02M 3/158* (2013.01); *Y02E 60/12* (2013.01); *Y02T 10/7055* (2013.01)

(56) References Cited

U.S. PATENT DOCUMENTS

| | | | |
|---|---|---|---|
| 4,171,508 A | 10/1979 | Sinclair | |
| 4,184,197 A | 1/1980 | Cuk et al. | |
| 4,222,000 A | 9/1980 | Silvertown et al. | |
| 5,362,942 A | 11/1994 | Vanderslice, Jr. et al. | |
| 5,396,165 A * | 3/1995 | Hwang et al. | 323/210 |
| 5,461,556 A | 10/1995 | Horie et al. | |
| 5,523,671 A | 6/1996 | Stewart | |
| 5,561,597 A | 10/1996 | Limpaecher | |
| 5,768,114 A | 6/1998 | Gruning et al. | |
| 5,789,905 A | 8/1998 | Yamasaki | |
| 5,808,469 A | 9/1998 | Kopera | |
| 5,905,371 A * | 5/1999 | Limpaecher | 320/166 |
| 5,943,224 A | 8/1999 | Mao | |
| 5,948,298 A | 9/1999 | Ijaz | |
| 5,990,661 A | 11/1999 | Ashtiani et al. | |
| 6,002,240 A | 12/1999 | McMahan et al. | |
| 6,072,301 A | 6/2000 | Ashtiani et al. | |
| 6,078,163 A | 6/2000 | Horie et al. | |
| 6,142,130 A | 11/2000 | Ward | |
| 6,211,652 B1 | 4/2001 | Glasgow | |
| 6,259,229 B1 * | 7/2001 | Ashtiani et al. | 320/128 |
| 6,340,879 B1 | 1/2002 | Bläcker | |
| 6,771,518 B2 | 8/2004 | Orr et al. | |
| 6,882,061 B1 | 4/2005 | Ashtiani et al. | |
| 7,292,010 B2 | 11/2007 | Hsu et al. | |
| 7,382,102 B2 | 6/2008 | Ashtiani | |
| 7,402,982 B2 | 7/2008 | Ito et al. | |
| 7,876,583 B2 | 1/2011 | Polivka et al. | |
| 8,004,866 B2 | 8/2011 | Bucella et al. | |
| 8,197,502 B2 | 6/2012 | Smith et al. | |
| 8,493,036 B2 | 7/2013 | Ferrario | |
| 2005/0077879 A1 | 4/2005 | Near | |
| 2005/0156578 A1 | 7/2005 | Kamenoff | |
| 2005/0168195 A1 | 8/2005 | MacDougall | |
| 2005/0264237 A1 | 12/2005 | Ishizuka | |
| 2007/0024243 A1 | 2/2007 | Liu et al. | |
| 2007/0091023 A1 | 4/2007 | Kosaka et al. | |
| 2007/0121258 A1 | 5/2007 | Hachiya | |
| 2009/0014436 A1 | 1/2009 | Toya et al. | |
| 2009/0243547 A1 | 10/2009 | Andelfinger | |
| 2011/0095711 A1 | 4/2011 | Hsieh et al. | |
| 2011/0144861 A1 | 6/2011 | Lakirovich et al. | |
| 2011/0273136 A1 * | 11/2011 | Yoshimoto | 320/103 |
| 2012/0024838 A1 | 2/2012 | Xu et al. | |
| 2012/0025754 A1 | 2/2012 | Xu et al. | |
| 2012/0025755 A1 | 2/2012 | Xu et al. | |
| 2012/0025756 A1 | 2/2012 | Xu et al. | |
| 2012/0025772 A1 | 2/2012 | Xu et al. | |
| 2012/0025774 A1 | 2/2012 | Xu et al. | |
| 2012/0025775 A1 | 2/2012 | Xu et al. | |
| 2012/0025776 A1 | 2/2012 | Xu et al. | |
| 2012/0025777 A1 | 2/2012 | Xu et al. | |
| 2012/0025778 A1 | 2/2012 | Xu et al. | |
| 2012/0025779 A1 | 2/2012 | Xu et al. | |
| 2012/0025780 A1 | 2/2012 | Xu et al. | |
| 2012/0025782 A1 | 2/2012 | Xu et al. | |
| 2012/0025783 A1 | 2/2012 | Xu et al. | |
| 2012/0031890 A1 | 2/2012 | Han et al. | |
| 2012/0032642 A1 | 2/2012 | Xu et al. | |
| 2012/0126753 A1 | 5/2012 | Carkner | |
| 2012/0161711 A1 | 6/2012 | Xu et al. | |
| 2012/0279951 A1 | 11/2012 | Xu et al. | |
| 2012/0280658 A1 | 11/2012 | Xu et al. | |
| 2012/0280659 A1 | 11/2012 | Xu et al. | |
| 2012/0299551 A1 | 11/2012 | Xu et al. | |
| 2012/0306432 A1 | 12/2012 | Xu et al. | |
| 2013/0127398 A1 | 5/2013 | Xu et al. | |
| 2013/0134146 A1 | 5/2013 | Han et al. | |
| 2013/0134945 A1 | 5/2013 | Xu et al. | |
| 2013/0141032 A1 | 6/2013 | Xu et al. | |

FOREIGN PATENT DOCUMENTS

| | | |
|---|---|---|
| CN | 1809942 A | 7/2006 |
| CN | 1836356 A | 9/2006 |
| CN | 1291518 C | 12/2006 |
| CN | 101552479 A | 10/2009 |
| CN | 201397868 Y | 2/2010 |
| CN | 101685971 A | 3/2010 |
| CN | 201435426 Y | 3/2010 |
| CN | 201667552 U | 12/2010 |
| CN | 102055042 A | 5/2011 |
| CN | 102074756 A | 5/2011 |
| CN | 201936966 U | 8/2011 |
| CN | 201936967 U | 8/2011 |
| CN | 201936969 U | 8/2011 |
| CN | 201966300 U | 9/2011 |
| CN | 202009059 U | 10/2011 |
| CN | 202042567 U | 11/2011 |
| CN | 202076380 U | 12/2011 |
| CN | 202103139 U | 1/2012 |
| CN | 202121024 U | 1/2012 |
| CN | 102074755 B | 5/2012 |
| CN | 102074758 B | 6/2012 |
| CN | 102074759 B | 6/2012 |
| CN | 102074753 B | 7/2012 |
| CN | 102074756 B | 7/2012 |
| CN | 102074760 B | 7/2012 |
| CN | 102074762 B | 7/2012 |
| CN | 102074761 B | 9/2012 |
| CN | 102088117 B | 9/2012 |
| CN | 102082306 B | 11/2012 |
| CN | 102088116 B | 11/2012 |
| EP | 0 418 919 A2 | 3/1991 |
| EP | 1 930 922 A2 | 6/2008 |
| JP | 4-12472 A | 1/1992 |
| JP | 5022876 A | 1/1993 |
| JP | 2007-166779 A | 6/2007 |
| JP | 4016045 B2 | 12/2007 |
| SU | 813544 B | 3/1981 |
| TW | 220014 B | 2/1994 |
| TW | 269727 B | 2/1996 |
| TW | 344721 B | 11/1998 |
| TW | 200518370 A | 6/2005 |
| TW | 200527793 A | 8/2005 |
| TW | M275625 U | 9/2005 |
| WO | WO 2010/145439 A1 | 12/2010 |

OTHER PUBLICATIONS

China Patent Office, Office Action dated Jul. 27, 2011, in related application CN 201010603717.7.

China Patent Office, Office Action dated Jul. 27, 2011, in related application CN 201010604714.5.

China Patent Office, Office Action dated Sep. 5, 2011, in related application CN 201010606082.6.

China Patent Office, Office Action dated Sep. 21, 2011, in related application CN 201010605772.X.

China Patent Office, Office Action dated Feb. 2, 2012, in related application CN 201010604777.0.

China Patent Office, Office Action dated Sep. 2, 2011, in related application CN 201010604777.0.

China Patent Office, Office Action dated Jan. 9, 2012, in related application CN 201010604729.1.

(56) References Cited

OTHER PUBLICATIONS

China Patent Office, Office Action dated Jul. 18, 2011, in related application CN 201010604729.1.
China Patent Office, Office Action dated Dec. 28, 2011, in related application CN 201010603719.6.
China Patent Office, Office Action dated Jul. 28, 2011, in related application CN 201010603719.6.
China Patent Office, Office Action dated Jan. 5, 2012, in related application CN 201010603471.3.
China Patent Office, Office Action dated Jul. 15, 2011, in related application CN 201010603471.3.
China Patent Office, Office Action dated Jul. 27, 2011, in related application CN 201010603414.5.
China Patent Office, Office Action dated Nov. 16, 2011, in related application CN 201010603414.5.
China Patent Office, Office Action dated Aug. 1, 2011, in related application CN 201010603669.1.
China Patent Office, Office Action dated Sep. 15, 2011, in related application CN 201010604677.8.
China Patent Office, Office Action dated Feb. 2, 2012, in related application CN 201010604744.6.
China Patent Office, Office Action dated Sep. 20, 2011, in related application CN 201010604744.6.
China Patent Office, Office Action dated Oct. 25, 2011, in related application CN 201110080853.7.
China Patent Office, Office Action dated Nov. 1, 2011, in related application CN 201110081219.5.
China Patent Office, Office Action dated Jan. 21, 2012, in related application CN 201110081276.3.
China Patent Office, Office Action dated Jun. 5, 2012, in related application CN 201110081276.3.
China Patent Office, Office Action dated May 16, 2012, in related application CN 201110137264.8.
China Patent Office, Office Action dated Jan. 21, 2012, in related application CN 201110132362.2.
China Patent Office, Office Action dated Jan. 21, 2012, in related application CN 201110134005.X.
China Patent Office, Office Action dated May 2, 2012, in related application CN 201110134005.X.
European Patent Office, Extended European Search Report dated Sep. 13, 2011, in related application EP 11166955.2.
European Patent Office, Extended European Search Report dated Nov. 30, 2011, in related application EP 11166938.8.
European Patent Office, Extended European Search Report dated Dec. 15, 2011, in related application EP 11166941.2.
European Patent Office, Extended European Search Report dated Sep. 16, 2011, in related application EP 11166949.5.
European Patent Office, Extended European Search Report dated Oct. 6, 2011, in related application EP 11166925.5.
European Patent Office, European Search Report dated Sep. 29, 2011, in related application EP 11166958.6.
European Patent Office, Extended European Search Report dated Jan. 25, 2012, in related application EP 11166952.9.
European Patent Office, European Search Report dated Sep. 21, 2011, in related application EP 11166969.3.
European Patent Office, European Search Report dated Sep. 1, 2011, in related application EP 11166903.2.
European Patent Office, Extended European Search Report dated Nov. 8, 2011, in related application EP 11166872.9.
European Patent Office, Extended European Search Report dated Nov. 25, 2011, in related application EP 11166882.8.
European Patent Office, Extended European Search Report dated Nov. 25, 2011, in related application EP 11166897.6.
European Patent Office, Extended European Search Report dated Sep. 6, 2011, in related application EP 11166900.8.
European Patent Office, Extended European Search Report dated Sep. 23, 2011, in related application EP 11166914.9.
European Patent Office, Extended European Search Report dated Nov. 8, 2011, in related application EP 11166920.6.
European Patent Office, Extended European Search Report dated Sep. 27, 2011, in related application EP 11167066.7.
European Patent Office, Extended European Search Report dated Sep. 8, 2011, in related application EP 11166902.4.
European Patent Office, Extended European Search Report dated Oct. 6, 2011, in related application EP 11167128.5.
Patent Cooperation Treaty, International Search Report and Written Opinion, dated Sep. 1, 2011, in related application PCT/CN2011/074449.
Patent Cooperation Treaty, International Search Report and Written Opinion, dated Aug. 18, 2011, in related application PCT/CN2011/074453.
Patent Cooperation Treaty, International Search Report and Written Opinion, dated Aug. 11, 2011, in related application PCT/CN2011/074463.
Patent Cooperation Treaty, International Search Report and Written Opinion, dated Aug. 25, 2011, in related application PCT/CN2011/074458.
Patent Cooperation Treaty, International Search Report and Written Opinion, dated Aug. 11, 2011, in related application PCT/CN2011/074462.
Patent Cooperation Treaty, International Search Report and Written Opinion, dated Aug. 11, 2011, in related application PCT/CN2011/074457.
Patent Cooperation Treaty, International Search Report and Written Opinion, dated Aug. 25, 2011, in related application PCT/CN2011/074459.
Patent Cooperation Treaty, International Search Report and Written Opinion, dated Aug. 18, 2011, in related application PCT/CN2011/074456.
Patent Cooperation Treaty, International Search Report and Written Opinion, dated Aug. 18, 2011, in related application PCT/CN2011/074460.
Patent Cooperation Treaty, International Search Report and Written Opinion, dated Aug. 11, 2011, in related application PCT/CN2011/074433.
Patent Cooperation Treaty, International Search Report and Written Opinion, dated Aug. 18, 2011, in related application PCT/CN2011/074436.
Patent Cooperation Treaty, International Search Report and Written Opinion, dated Aug. 25, 2011, in related application PCT/CN2011/074438.
Patent Cooperation Treaty, International Search Report and Written Opinion, dated Aug. 11, 2011, in related application PCT/CN2011/074440.
Patent Cooperation Treaty, International Search Report and Written Opinion, dated Aug. 25, 2011, in related application PCT/CN2011/074455.
Patent Cooperation Treaty, International Search Report and Written Opinion, dated Aug. 11, 2011, in related application PCT/CN2011/074461.
Patent Cooperation Treaty, International Search Report and Written Opinion, dated Sep. 1, 2011, in related application PCT/CN2011/074531.
Patent Cooperation Treaty, International Search Report and Written Opinion, dated Aug. 18, 2011, in related application PCT/CN2011/074442.
Patent Cooperation Treaty, International Search Report and Written Opinion, dated Jul. 21, 2011, in related application PCT/CN2011/074536.
United States Patent and Trademark Office, Office Action mailed Jul. 16, 2013, in related U.S. Appl. No. 13/166,281.
United States Patent and Trademark Office, Office Action mailed May 31, 2013, in related U.S. Appl. No. 13/168,004.
United States Patent and Trademark Office, Office Action mailed May 22, 2013, in related U.S. Appl. No. 13/168,014.
United States Patent and Trademark Office, Office Action mailed Jul. 5, 2013, in U.S. Appl. No. 13/170,021.
United States Patent and Trademark Office, Office Action mailed Jul. 30, 2013, in related U.S. Appl. No. 13/166,301.
United States Patent and Trademark Office, Office Action mailed Sep. 5, 2013, in related U.S. Appl. No. 13/189,096.

(56) References Cited

OTHER PUBLICATIONS

United States Patent and Trademark Office, Office Action mailed Aug. 29, 2013, in related U.S. Appl. No. 13/187,874.
United States Patent and Trademark Office, Office Action mailed Aug. 29, 2013, in related U.S. Appl. No. 13/189,114.
United States Patent and Trademark Office, Office Action mailed Sep. 30, 2013, in related U.S. Appl. No. 13/170,044.
United States Patent and Trademark Office, Office Action mailed Jun. 19, 2013, in related U.S. Appl. No. 13/187,890.
United States Patent and Trademark Office, Office Action mailed Jun. 10, 2014, in related U.S. Appl. No. 13/168,004.
United States Patent and Trademark Office, Office Action mailed Jun. 18, 2014, in related U.S. Appl. No. 13/168,014.
United States Patent and Trademark Office, Office Action mailed Jun. 16, 2014, in related U.S. Appl. No. 13/184,879.
United States Patent and Trademark Office, Office Action mailed Jun. 20, 2014, in related U.S. Appl. No. 13/184,894.
United States Patent and Trademark Office, Office Action mailed Jun. 25, 2014, in related U.S. Appl. No. 13/187,266.
United States Patent and Trademark Office, Office Action mailed Jun. 24, 2014, in related U.S. Appl. No. 13/184,906.
United States Patent and Trademark Office, Office Action mailed Jun. 17, 2014, in related U.S. Appl. No. 13/185,744.
United States Patent and Trademark Office, Office Action mailed Jun. 24, 2014, in U.S. Appl. No. 13/187,279.
United States Patent and Trademark Office, Office Action mailed Jun. 13, 2014, in related U.S. Appl. No. 13/185,756.
United States Patent and Trademark Office, Office Action mailed Jul. 7, 2014, in related U.S. Appl. No. 13/187,890.
United States Patent and Trademark Office, Office Action mailed Jun. 25, 2014, in related U.S. Appl. No. 13/541,487.
United States Patent and Trademark Office, Office Action mailed Jun. 26, 2014, in related U.S. Appl. No. 13/748,525.
United States Patent and Trademark Office, Office Action mailed Jun. 24, 2014, in related U.S. Appl. No. 13/749,480.
United States Patent and Trademark Office, Notice of Allowance mailed Apr. 25, 2014, in related U.S. Appl. No. 13/166,281.
United States Patent and Trademark Office, Notice of Allowance mailed Jun. 24, 2014, in related U.S. Appl. No. 13/170,021.
United States Patent and Trademark Office, Notice of Allowance mailed May 2, 2014, in related U.S. Appl. No. 13/166,301.
United States Patent and Trademark Office, Notice of Allowance mailed Jun. 18, 2014, in related U.S. Appl. No. 13/189,096.
United States Patent and Trademark Office, Notice of Allowance mailed May 8, 2014, in related U.S. Appl. No. 13/187,874.
United States Patent and Trademark Office, Notice of Allowance mailed Apr. 28, 2014, in related U.S. Appl. No. 13/189,114.
United States Patent and Trademark Office, Notice of Allowance mailed May 22, 2014, in related U.S. Appl. No. 13/170,044.
United States Patent and Trademark Office, Notice of Allowance mailed Oct. 7, 2014, in related U.S. Appl. No. 13/541,487.
United States Patent and Trademark Office, Notice of Allowance mailed Oct. 6, 2014, in related U.S. Appl. No. 13/748,525.
United States Patent and Trademark Office, Notice of Allowance mailed Oct. 6, 2014, in related U.S. Appl. No. 13/749,480.
United States Patent and Trademark Office, Office Action mailed Nov. 13, 2014, in related U.S. Appl. No. 13/168,004.
United States Patent and Trademark Office, Office Action mailed Nov. 17, 2014, in related U.S. Appl. No. 13/187,266.
United States Patent and Trademark Office, Office Action mailed Sep. 26, 2014, in related U.S. Appl. No. 13/544,881.
United States Patent and Trademark Office, Office Action mailed Sep. 3, 2014, in related U.S. Appl. No. 13/486,883.
United States Patent and Trademark Office, Office Action mailed Sep. 11, 2014, in related U.S. Appl. No. 13/465,906.
United States Patent and Trademark Office, Office Action mailed Sep. 11, 2014, in related U.S. Appl. No. 13/545,885.
United States Patent and Trademark Office, Notice of Allowance mailed Oct. 6, 2014, in U.S. Appl. No. 13/168,014.
United States Patent and Trademark Office, Notice of Allowance mailed Oct. 6, 2014, in related U.S. Appl. No. 13/184,906.
United States Patent and Trademark Office, Notice of Allowance mailed Oct. 6, 2014, in related U.S. Appl. No. 13/187,279.
United States Patent and Trademark Office, Notice of Allowance mailed Oct. 3, 2014, in related U.S. Appl. No. 13/187,890.
Taiwan Intellectual Property Office, Office Action dated Jan. 10, 2014, in related application TW 100143128.
Taiwan Intellectual Property Office, Office Action dated Jan. 10, 2014, in related application TW 100143130.
Taiwan Intellectual Property Office, Office Action dated Jan. 10, 2014, in related application TW 100143133.
Taiwan Intellectual Property Office, Office Action dated Jan. 7, 2014, in related application TW 100140587.
Taiwan Intellectual Property Office, Office Action dated Jan. 6, 2014, in related application TW 100140588.
Taiwan Intellectual Property Office, Office Action dated Feb. 17, 2014, in related application TW 100143160.
Taiwan Intellectual Property Office, Office Action dated Jan. 6, 2014, in related application TW 100140590.
Taiwan Intellectual Property Office, Office Action dated Jan. 17, 2014, in related application TW 100141797.
Taiwan Intellectual Property Office, Office Action dated Jan. 17, 2014, in related application TW 100141802.
United States Patent and Trademark Office, Notice of Allowance mailed Dec. 5, 2013, in related U.S. Appl. No. 13/166,281.
United States Patent and Trademark Office, Notice of Allowance mailed Nov. 8, 2013, in related U.S. Appl. No. 13/166,301.
United States Patent and Trademark Office, Notice of Allowance mailed Jan. 6, 2014, in related U.S. Appl. No. 13/189,096.
United States Patent and Trademark Office, Notice of Allowance mailed Jan. 6, 2014, in related U.S. Appl. No. 13/187,874.
United States Patent and Trademark Office, Office Action mailed Nov. 20, 2013, in related U.S. Appl. No. 13/168,004.
United States Patent and Trademark Office, Office Action mailed Nov. 22, 2013, in related U.S. Appl. No. 13/168,014.
United States Patent and Trademark Office, Final Office Action mailed Feb. 25, 2014, in related U.S. Appl. No. 13/170,021.
United States Patent and Trademark Office, Office Action mailed Jan. 6, 2014, in related U.S. Appl. No. 13/187,266.
United States Patent and Trademark Office, Office Action mailed Jan. 3, 2014, in related U.S. Appl. No. 13/184,906.
United States Patent and Trademark Office, Office Action mailed Jan. 2, 2014, in related U.S. Appl. No. 13/189,114.
United States Patent and Trademark Office, Office Action mailed Dec. 3, 2013, in related U.S. Appl. No. 13/187,279.
United States Patent and Trademark Office, Office Action mailed Dec. 4, 2013, in related U.S. Appl. No. 13/187,890.
United States Patent and Trademark Office, Office Action mailed Jan. 6, 2014, in related U.S. Appl. No. 13/541,487.
United States Patent and Trademark Office, Office Action mailed Dec. 4, 2013, in related U.S. Appl. No. 13/748,525.
United States Patent and Trademark Office, Office Action mailed Dec. 11, 2014, in related U.S. Appl. No. 13/184,879.
United States Patent and Trademark Office, Office Action mailed Dec. 24, 2014, in related U.S. Appl. No. 13/184,894.
United States Patent and Trademark Office, Office Action mailed Dec. 31, 2014, in related U.S. Appl. No. 13/185,744.
United States Patent and Trademark Office, Office Action mailed Dec. 31, 2014, in related U.S. Appl. No. 13/185,756.
United States Patent and Trademark Office, Office Action mailed Feb. 13, 2015, in related U.S. Appl. No. 13/465,906.
United States Patent and Trademark Office, Corrected Notice of Allowability mailed Feb. 11, 2015, in related U.S. Appl. No. 13/187,279.
United States Patent and Trademark Office, Notice of Allowance mailed Feb. 18, 2015, in related U.S. Appl. No. 13/168,004.
United States Patent and Trademark Office, Notice of Allowance mailed Mar. 3, 2015, in related U.S. Appl. No. 13/544,881.
United States Patent and Trademark Office, Corrected Notice of Allowability mailed Feb. 23, 2015, in related U.S. Appl. No. 13/748,525.

(56) References Cited

OTHER PUBLICATIONS

United States Patent and Trademark Office, Office Action mailed Jan. 15, 2014, in related U.S. Appl. No. 13/749,480.
United States Patent and Trademark Office, Office Action mailed Mar. 25, 2015, in related U.S. Appl. No. 13/187,266.
United States Patent and Trademark Office, Office Action mailed Apr. 1, 2015, in related U.S. Appl. No. 13/747,387.
United States Patent and Trademark Office, Office Action mailed Apr. 13, 2015, in related U.S. Appl. No. 13/545,885.
United States Patent and Trademark Office, Corrected Notice of Allowability mailed Apr. 3, 2015, in related U.S. Appl. No. 13/168,004.
United States Patent and Trademark Office, Notice of Allowance mailed Mar. 18, 2015, in related U.S. Appl. No. 13/184,879.
United States Patent and Trademark Office, Notice of Allowance mailed Mar. 27, 2015, in related U.S. Appl. No. 13/184,894.
United States Patent and Trademark Office, Notice of Allowance mailed Mar. 23, 2015, in related U.S. Appl. No. 13/185,744.
United States Patent and Trademark Office, Notice of Allowance mailed Apr. 29, 2015, in related U.S. Appl. No. 13/185,756.
United States Patent and Trademark Office, Supplemental Notice of Allowability mailed Mar. 17, 2015, in related U.S. Appl. No. 13/544,881.
United States Patent and Trademark Office, Notice of Allowance mailed Mar. 27, 2015, in related U.S. Appl. No. 13/747,378.
United States Patent and Trademark Office, Notice of Allowance mailed Mar. 18, 2015, in related U.S. Appl. No. 13/486,883.
United States Patent and Trademark Office, Corrected Notice of Allowability mailed May 13. 2015, in related U.S. Appl. No. 13/168,004.
United States Patent and Trademark Office, Corrected Notice of Allowability mailed May 20, 2015, in related U.S. Appl. No. 13/184,894.
United States Patent and Trademark Office, Supplemental Notice of Allowability mailed May 20, 2015, in related U.S. Appl. No. 13/544,881.
United States Patent and Trademark Office, Supplemental Notice of Allowability mailed May 13. 2015, in related U.S. Appl. No. 13/747,378.
United States Patent and Trademark Office, Notice of Allowance mailed May 20, 2015, in related U.S. Appl. No. 13/465,906.

* cited by examiner

BATTERY HEATING CIRCUITS AND METHODS BASED ON BATTERY DISCHARGING AND CHARGING USING RESONANCE COMPONENTS IN SERIES AND MULTIPLE CHARGE STORAGE COMPONENTS

1. CROSS-REFERENCE TO RELATED APPLICATIONS

This application claims priority to Chinese Patent Application No. 201010245288.0, filed Jul. 30, 2010, Chinese Patent Application No. 201010274785.3, filed Aug. 30, 2010, and Chinese Patent Application No. 201110081276.3, filed Mar. 31, 2011, all these three applications being incorporated by reference herein for all purposes.

Additionally, this application is related to International Application Publication No. WO2010/145439A1 and Chinese Application Publication No. CN102055042A, both these two applications being incorporated by reference herein for all purposes.

2. BACKGROUND OF THE INVENTION

The present invention pertains to electric and electronic field, in particular related to a battery heating circuit.

Considering cars need to run under complex road conditions and environmental conditions or some electronic devices are used under harsh environmental conditions, the battery, which serves as the power supply unit for electric-motor cars or electronic devices, need to be adaptive to these complex conditions. In addition, besides these conditions, the service life and charge/discharge cycle performance of the battery need to be taken into consideration; especially, when electric-motor cars or electronic devices are used in low temperature environments, the battery needs to have outstanding low-temperature charge/discharge performance and higher input/output power performance.

Usually, under low temperature conditions, the resistance of the battery will increase, and so will the polarization; therefore, the capacity of the battery will be reduced.

To keep the capacity of the battery and improve the charge/discharge performance of the battery under low temperature conditions, some embodiments of the present invention provide a battery heating circuit.

3. BRIEF SUMMARY OF THE INVENTION

The objective of certain embodiments of the present invention is to provide a battery heating circuit, in order to solve the problem of decreased capacity of the battery caused by increased resistance and polarization of the battery under low temperature conditions.

One embodiment of the present invention provides a battery heating circuit, comprising a plurality of switch units, a switching control module, a damping component R1, an energy storage circuit, and a polarity inversion unit, wherein: the energy storage circuit is connected with the battery, and comprises a current storage component L1 and a plurality of charge storage components C1; the plurality of charge storage components C1 are connected with the plurality of switch units in series in one-to-one correspondence to form a plurality of branches; the plurality of branches are connected in parallel with each other and then connected with the current storage component L1 and damping component R1 in series; the switching control module is connected with the switch units, and is configured to control ON/OFF of the switch units, so that the energy flows back-and-forth between the battery and the energy storage circuit when the switch units switch on; the polarity inversion unit is connected with the energy storage circuit, and is configured to invert the voltage polarity of the plurality of charge storage components C1 after the switch units switch from ON state to OFF state.

Other characteristics and advantages of the present invention will be further described in detail in the following section for embodiments.

4. BRIEF DESCRIPTION OF THE DRAWINGS

The accompanying drawings, as a part of this description, are provided here to facilitate further understanding of the present invention, and are used in conjunction with the following embodiments to explain the present invention, but shall not be comprehended as constituting any limitation on the present invention. In the figures.

5. DETAILED DESCRIPTION OF THE INVENTION

Figure 1:
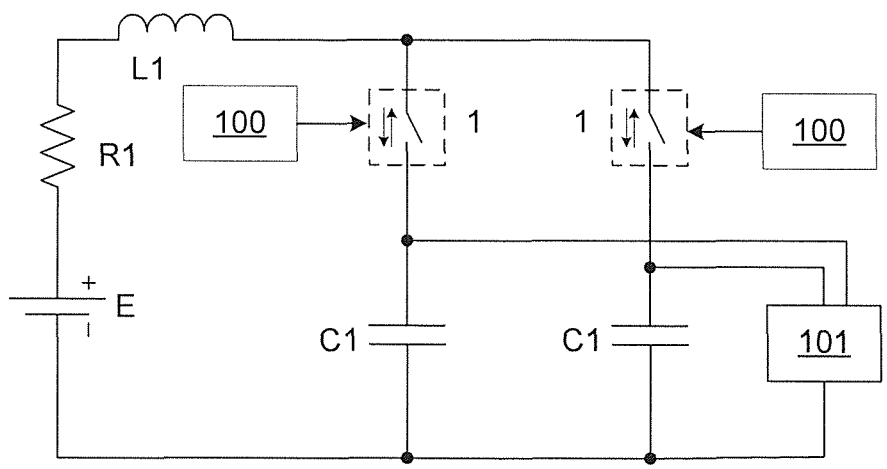
FIG. 1 is a schematic diagram of the battery heating circuit provided in one embodiment of the present invention.

Certain embodiments of the present invention are described in detail below, with reference to the accompanying drawings. It should be appreciated that the embodiments described here are only provided to describe and explain the present invention, but shall not be deemed as constituting any limitation on the present invention.

It is noted that, unless otherwise specified, when mentioned hereafter in this description, the term "switching control module" may refer to any controller that can output control commands (e.g., pulse waveforms) under preset conditions or at preset times and thereby control the switch unit connected to it to switch on or switch off accordingly, according to some embodiments. For example, the switching control module can be a PLC. Unless otherwise specified, when mentioned hereafter in this description, the term "switch" may refer to a switch that enables ON/OFF control by using electrical signals or enables ON/OFF control on the basis of the characteristics of the component according to certain embodiments. For example, the switch can be either a one-way switch (e.g., a switch composed of a two-way switch and a diode connected in series, which can be conductive in one direction) or a two-way switch (e.g., a Metal Oxide Semiconductor Field Effect Transistor (MOSFET) or an IGBT with an anti-parallel freewheeling diode). Unless otherwise specified, when mentioned hereafter in this description, the term "two-way switch" may refer to a switch that can be conductive in two directions, which can enable ON/OFF control by using electrical signals or enable ON/OFF control on the basis of the characteristics of the component according to some embodiments. For example, the two-way switch can be a MOSFET or an IGBT with an anti-parallel freewheeling diode. Unless otherwise specified, when mentioned hereafter in this description, the term "one-way semiconductor component" may refer to a semiconductor component that can be conductive in one direction, such as a diode, according to certain embodiments. Unless otherwise specified, when mentioned hereafter in this description, the term "charge storage component" may refer to any device that can enable charge storage, such as a capacitor, according to some embodiments. Unless otherwise specified, when mentioned hereafter in this description, the term "current storage component" may refer to any device that can store current, such as an inductor, according to certain embodiments. Unless otherwise specified, when mentioned hereafter in this description, the term "forward direction" may refer to the direction in which the energy flows from the battery to the energy storage circuit, and the term "reverse direction" may refer to the direction in which the energy flows from the energy storage circuit to the battery, according to some embodiments. Unless otherwise specified, when mentioned hereafter in this description, the term "battery" may comprise primary battery (e.g., dry battery or alkaline battery, etc.) and secondary battery (e.g., lithium-ion battery, nickel-cadmium battery, nickel-hydrogen battery, or lead-acid battery, etc.), according to certain embodiments. Unless otherwise specified, when mentioned hereafter in this description, the term "damping component" may refer to any device that inhibits current flow and thereby enables energy consumption, such as a resistor, etc., according to some embodiments. Unless otherwise specified, when mentioned hereafter in this description, the term "main loop" may refer to a loop composed of battery, damping component, switch unit and energy storage circuit connected in series according to certain embodiments.

It should be noted specially that, considering different types of batteries have different characteristics, in some embodiments of the present invention, "battery" may refer to an ideal battery that does not have internal parasitic resistance and parasitic inductance or has very low internal parasitic resistance and parasitic inductance, or may refer to a battery pack that has internal parasitic resistance and parasitic inductance; therefore, those skilled in the art should appreciate that if the battery is an ideal battery that does not have internal parasitic resistance and parasitic inductance or has very low internal parasitic resistance and parasitic inductance, the damping component R1 may refer to a damping component external to the battery and the current storage component L1 may refer to a current storage component external to the battery; if the battery is a battery pack that has internal parasitic resistance and parasitic inductance, the damping component R1 may refer to a damping component external to the battery or refer to the parasitic resistance in the battery pack, and the current storage component L1 may refer to a current storage component external to the battery or refer to the parasitic inductance in the battery pack, according to certain embodiments.

To ensure the normal service life of the battery, according to some embodiments, the battery can be heated under low temperature condition, which is to say, when the heating condition is met, the heating circuit is controlled to start heating for the battery; when the heating stop condition is met, the heating circuit is controlled to stop heating, according to certain embodiments.

In the actual application of battery, the battery heating condition and heating stop condition can be set according to the actual ambient conditions, to ensure normal charge/discharge performance of the battery, according to some embodiments.

In order to heat up the battery E located in the low temperature environment, one embodiment of the present invention provides a battery heating circuit; as shown in FIG. 1, the battery heating circuit comprises a plurality of switch units 1, a switching control module 100, a damping component R1, an energy storage circuit, and a polarity inversion unit 101, wherein: the energy storage circuit is connected with the battery, and comprises a current storage component L1 and a plurality of charge storage components C1; the plurality of charge storage components C1 are connected with the plurality of switch units 1 in series in one-to-one correspondence to form a plurality of branches; the plurality of branches are connected in parallel with each other and then connected with the current storage component L1 and damping component R1 in series; the switching control module 100 is connected with the switch units 1, and is configured to control ON/OFF of the switch units 1, so that the energy flows back-and-forth between the battery and the energy storage circuit when the switch units 1 switch on; the polarity inversion unit 101 is connected with the energy storage circuit, and is configured to invert the voltage polarity of the plurality of charge storage components C1 after the switch units 1 switch from ON state to OFF state.

It should be noted specially that in view different types of batteries have different characteristics, in certain embodiments of the present invention, if the battery E has very high internal parasitic resistance and parasitic inductance, the damping component R1 could refers to the parasitic resistance in the battery pack; likewise, the current storage component L2 could refers to the parasitic inductance in the battery pack.

The switching control module 100 can control the energy to flow from the battery E to the charge storage components C1 at the same time or in sequence, and control the energy to flow from the charge storage components C1 to the battery E at the same time or in sequence, by controlling the switch units 1. Wherein: the control of energy flow to the charge storage components C1 "at the same time" and energy flow back to the battery E "at the same time" can be implemented by controlling the switch units in the plurality of branches to switch on at the same time. The control of energy flow to the charge storage components C1 "in sequence" and energy flow back to the battery E "in sequence" can be implemented by controlling the switch units 1 in the plurality of branches to switch on in an appropriate sequence. For example, the plurality of switch units 1 can be controlled to switch on at different times, so that energy charge/discharge can be accomplished through the plurality of branches at different times; or, the plurality of switch units 1 can be grouped into switch unit groups, wherein: the switch units in each switch unit group can be controlled to switch on at the same time, while the switch unit groups can be controlled to switch on at different times; in that way, energy charge/discharge can be accomplished through the respective branches corresponding to the respective switch unit groups at different times. Preferably, the switching control module 100 controls the switch units 1 in a way that the energy can flow from the battery E to the plurality of charge storage components C1 at the same time and flow from the charge storage components C1 back to the battery E in sequence. In such one embodiment, when the current flows in forward direction, the battery E discharges; in that state, the plurality of charge storage components C1 can be connected with the battery E at the same time, so as to increase the current; when the current flows in reverse direction, the battery E is charged; in that state, the plurality of charge storage components C1 can be connected with the battery E in sequence, so as to decrease the current flow through the battery E.

Figure 2:
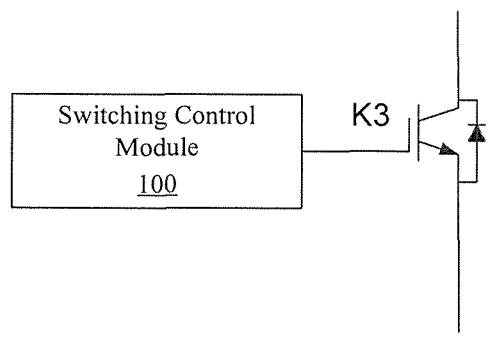
FIG. 2 is a schematic diagram of one embodiment of the switch unit shown in FIG. 1.

The switch units 1 can be implemented in a plurality of ways. Certain embodiments of the present invention do not impose any limitation to the specific implementation of the switch units. In one embodiment of the switch units 1, the switch units 1 are a two-way switch K3, as shown in FIG. 2. The switching control module 100 controls ON/OFF of the two-way switch K3; when the battery is to be heat up, the two-way switch K3 can be controlled to switch on; if heating is to be paused or is not needed, the two-way switch K3 can be controlled to switch off.

Employing a separate two-way switch K3 to implement the switch unit 1 can simplify the circuit, reduce system footprint, and facilitate the implementation; however, to implement cut-off of reverse current, the following embodiment of the switch unit 1 is further provided in the present invention.

Preferably, the switch unit 1 comprises a first one-way branch configured to enable energy flow from the battery E to the energy storage circuit, and a second one-way branch configured to enable energy flow from the energy storage circuit to the battery E; wherein: the switching control module 100 is connected to either or both of the first one-way branch and second one-way branch, to control ON/OFF of the connected branches.

When the battery is to be heated, both the first one-way branch and the second one-way branch can be controlled to switch on; when heating is to be paused, either or both of the first one-way branch and the second one-way branch can be controlled to switch off; when heating is not needed, both of the first one-way branch and the second one-way branch can be controlled to switch off. Preferably, both of the first one-way branch and the second one-way branch are subject to the control of the switching control module 100; thus, energy flow cut-off in forward direction and reverse direction can be implemented flexibly.

Figure 3:
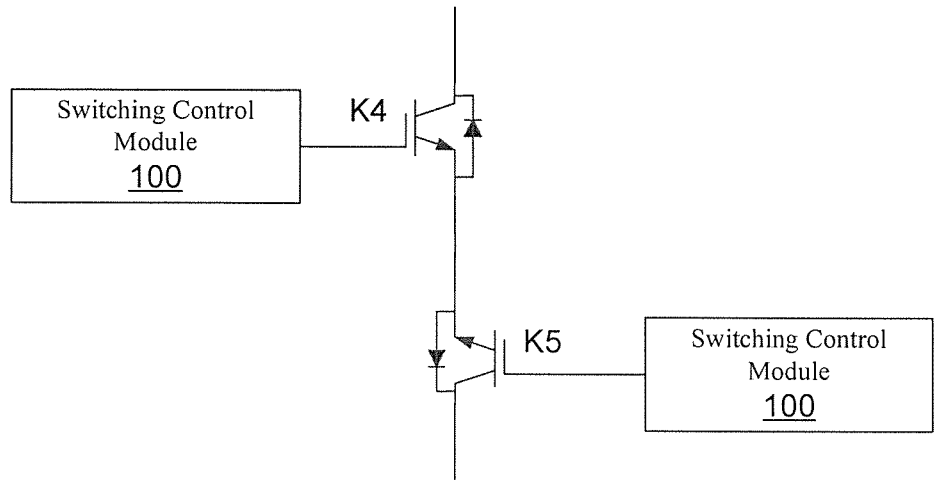
FIG. 3 is a schematic diagram of one embodiment of the switch unit shown in FIG. 1.

In another embodiment of the switch unit 1, as shown in FIG. 3, the switch unit 1 may comprise a two-way switch K4 and a two-way switch K5, wherein: the two-way switch K4 and the two-way switch K5 are connected in series opposite to each other, to form the first one-way branch and the second one-way branch; the switching control module 100 is connected with the two-way switch K4 and the two-way switch K5 respectively, to control ON/OFF of the first one-way branch and the second one-way branch by controlling ON/OFF of the two-way switch K4 and two-way switch K5.

When the battery is to be heated, the two-way switches K4 and K5 can be controlled to switch on; when heating is to be paused, either or both of the two-way switch K4 and two-way switch K5 can be controlled to switch off; when heating is not needed, both of the two-way switch K4 and two-way switch K5 can be controlled to switch off. In such an implementation of switch units 1, the first one-way branch and the second one-way branch can be controlled separately to switch on or off, and therefore energy flow cut-off in forward direction and reverse direction in the circuit can be implemented flexibly.

Figure 5:
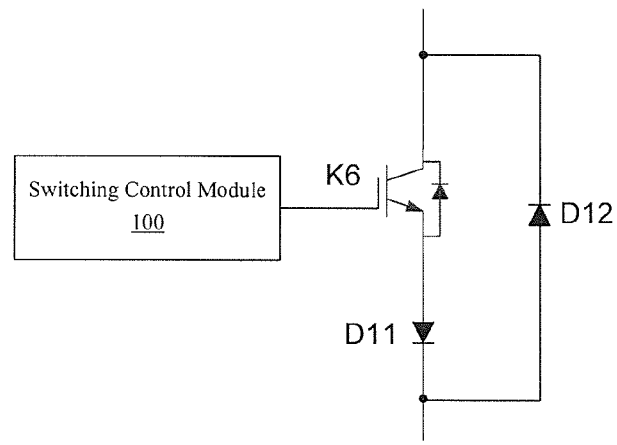
FIG. 5 is a schematic diagram of one embodiment of the switch unit shown in FIG. 1.

In another embodiment of switch unit 1, as shown in FIG. 5, the switch unit 1 may comprise a switch K6, a one-way semiconductor component D11, and a one-way semiconductor component D12, wherein: the switch K6 and the one-way semiconductor component D11 are connected in series with each other to form the first one-way branch; the one-way semiconductor component D12 forms the second one-way branch; the switching control module 100 is connected with the switch K6, to control ON/OFF of the first one-way branch by controlling ON/OFF of the switch K6. In the switch unit 1 shown in FIG. 11, when heating is needed, the switch K6 can be controlled to switch on; when heating is not needed, the switch K6 can be controlled to switch off.

Figure 6:
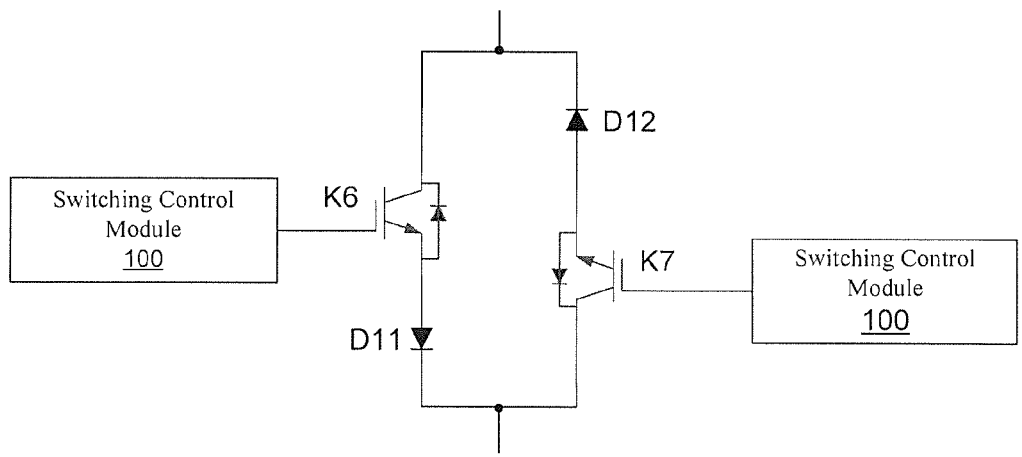
FIG. 6 is a schematic diagram of one embodiment of the switch unit shown in FIG. 1.

Though the implementation of switch unit 1 shown in FIG. 5 enables to-and-fro energy flow along separate branches, it cannot enable energy flow cut-off function in reverse direction. The present invention further puts forward another embodiment of switch unit 1; as shown in FIG. 6, the switch unit 1 can further comprise a switch K7 in the second one-way branch, wherein: the switch K7 is connected with the one-way semiconductor component D12 in series, the switching control module 100 is also connected with the switch K7, and is configured to control ON/OFF of the second one-way branch by controlling ON/OFF of the switch K7. Thus, in the switch unit 1 shown in FIG. 6, since there are switches (i.e., switch K6 and switch K7) in both one-way branches, energy flow cut-off function in forward direction and reverse direction is enabled simultaneously.

Figure 4:
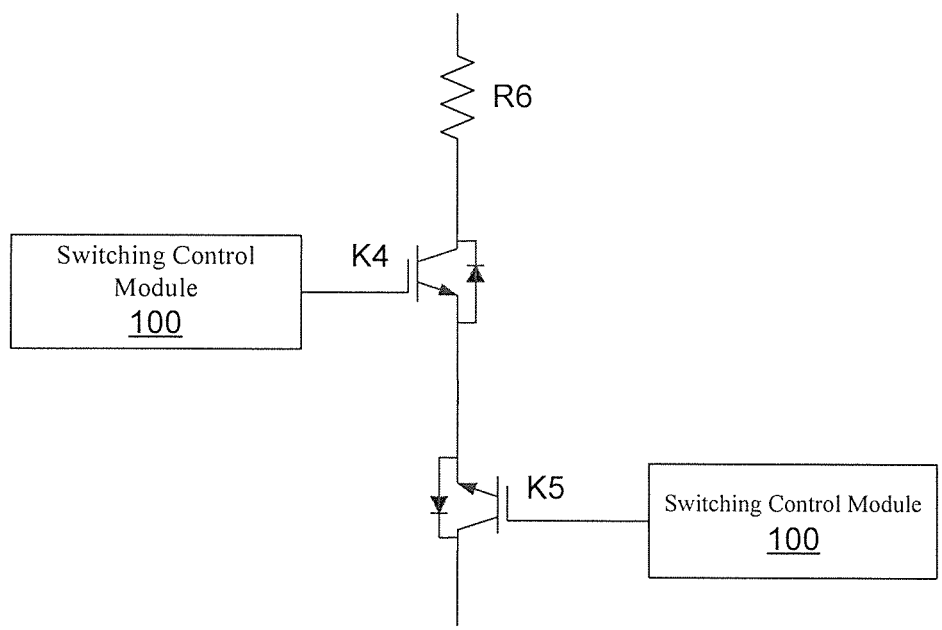
FIG. 4 is a schematic diagram of one embodiment of the switch unit shown in FIG. 1.
Figure 7:
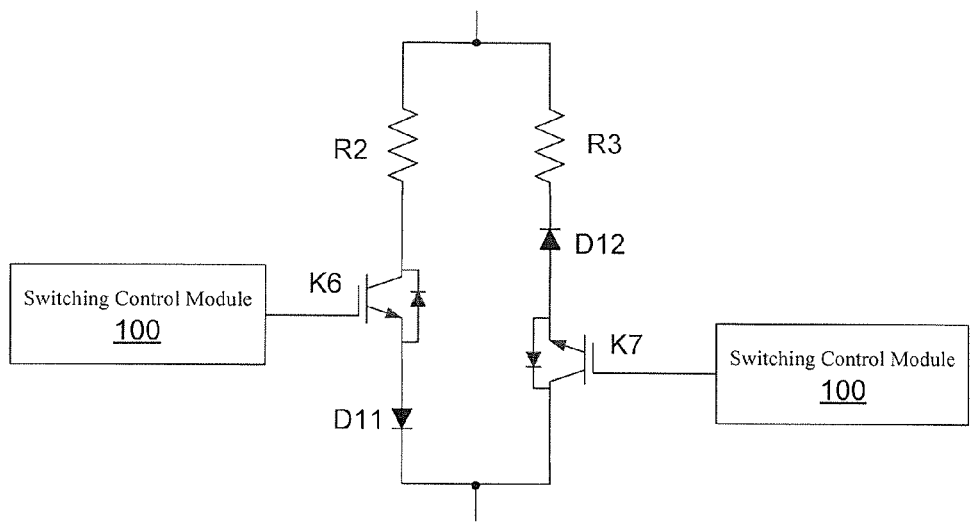
FIG. 7 is a schematic diagram of one embodiment of the switch unit shown in FIG. 1.

Preferably, the switch unit 1 can further comprise a resistor, which is connected in series with the first one-way branch and/or the second one-way branch and is configured to reduce the current in the heating circuit for the battery E and to avoid damage to the battery E resulted from over-current in the circuit. For example, a resistor R6 connected in series with the two-way switch K4 and the two-way switch K5 can be added in the switch unit 1 shown in FIG. 3, to obtain another implementation of the switch unit 1, as shown in FIG. 4. FIG. 7 also shows one embodiment of the switch unit 1, which is obtained by connecting respectively resistor R2 and resistor R3 in series in both the one-way branches in the switch unit 1 shown in FIG. 6.

In the technical scheme of certain embodiments of the present invention, when the battery E is to be heated up, the switching control module 100 controls the plurality of switch units 1 to switch on at the same time or in sequence, and thereby the battery E and the energy storage circuits are connected in series to form a loop, and the battery E charges the charge storage components C1; when the current in the loop reaches zero in forward direction after the peak current, the charge storage components C1 begin to discharge, and therefore the current flows from the charge storage components C1 back to the battery E; since both the current flow in forward direction and the current flow in reverse direction in the loop flow though the damping component R1, the purpose of heating up the battery E is attained by using the heat generation in the damping component R1. Above charge/discharge process can be performed cyclically. When the temperature of the battery E rises to the heating stop condition, the switching control module 100 can control the switch units 1 to switch off, and thereby the heating circuit will stop operation.

In the heating process described above, when the current flows from the energy storage circuit back to the battery E, the energy in the charge storage components C1 will not flow back to the battery E completely; instead, some energy will remain in the charge storage components C1, and ultimately the voltage across the charge storage components C1 is close or equal to the voltage of the battery, and therefore the energy flow from the battery E to the charge storage components C1 cannot continue anymore; that phenomenon is adverse to the cyclic operation of the heating circuit. Therefore, after the switch units 1 switch from ON state to OFF state, the voltage polarity of the charge storage components C1 is inverted by using a polarity inversion unit 101 in one embodiment of the present invention; since the voltage across the charge storage components C1 can be added serially with the voltage of the battery E after polarity inversion, the discharging current in the heating circuit can be increased when the switch units 1 switch on again. The switch units 1 can be controlled to switch off at any time in one or more cycles; the switch units 1 can be controlled to switch off at any time, for example, when the current flow in the circuit is in forward direction/reverse direction, and when the current flow is zero or not zero. A specific implementation form of switch units 1 can be selected, depending on the needed cut-off strategy; if current flow cut-off in forward direction is only needed, the implementation form of switch units 1 shown in FIG. 2 or FIG. 5 can be selected; if current flow cut-off in forward direction and reverse direction is needed, the switch units with two controllable one-way branches shown in FIG. 4, FIG. 6, or FIG. 7 can be selected. Preferably, the switching control module 100 is configured to control the switch units 1 to switch off when the current flow though the switch units 1 is zero after the switch units 1 switch on, so as to improve the working efficiency of the circuit. In addition, the disturbance to the entire circuit is minimal if the switch units 1 switch off when the current flow in the circuit is zero.

Figure 8:
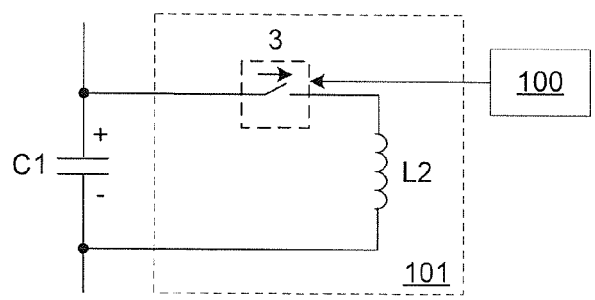
FIG. 8 is a schematic diagram of one embodiment of the polarity inversion unit shown in FIG. 1.

In one embodiment of the polarity inversion unit 101, the polarity inversion unit 101 comprises a plurality of circuits, which are connected with the plurality of charge storage components C1 one-to-one correspondence, wherein: as shown in FIG. 8, each polarity inversion unit comprises a one-way switch 3 and a current storage component L2 connected in series with each other; the switching control module 100 is also connected with the one-way switches 3, and is configured to invert the voltage polarity of the plurality of charge storage components C1 by controlling the one-way switches to switch on; the inversion can be performed for the plurality of charge storage components C1 at the same time or in sequence.

Figure 9:
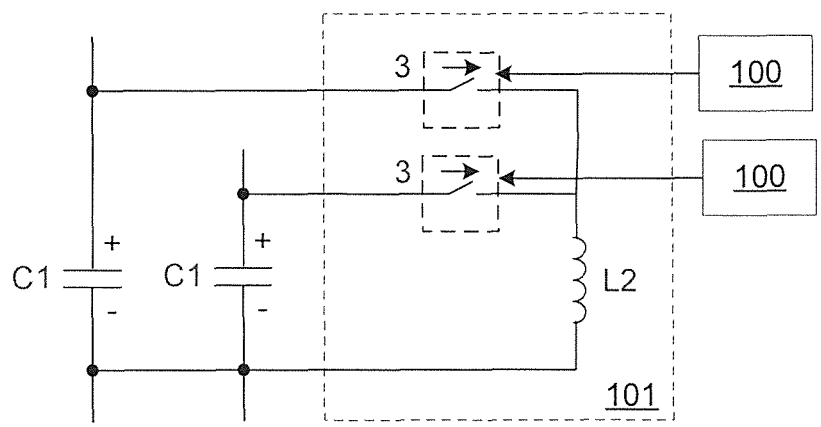
FIG. 9 is a schematic diagram of one embodiment of the polarity inversion unit shown in FIG. 1.

In another embodiment of the polarity inversion unit 101, as shown in FIG. 9, the polarity inversion unit 101 comprises a plurality of one-way switches 3 and a current storage component L2; wherein: the plurality of one-way switches 3 are connected at one end to the plurality of charge storage components C1 at one end in one-to-one correspondence; the plurality of one-way switches 3 are connected at the other end to one end of the current storage component L2, and the other end of the current storage component L2 is connected to the plurality of charge storage components C1 at the other end; the switching control module 100 is also connected with the one-way switches 3, and is configured to invert the voltage polarity of the plurality of charge storage components C1 at the same time or in sequence by controlling the one-way switches 3 to switch on. In such one embodiment, the polarity inversion process of the plurality charge storage components C1 can be implemented with one current storage component L2; therefore, the number of components can be reduced; in addition, preferably, the switching control module 100 implements the voltage polarity inversion of the plurality of the charge storage components C1 in sequence by controlling the switch-on times of the plurality of the one-way switches 3; in that scheme, since the voltage polarity of the plurality of the charge storage components C1 is not inverted at the same time, the size of the current storage component L2 needed in the polarity inversion unit 101 can be further reduced, and therefore the size and weight of the battery heating circuit can be further reduced.

Figure 10:
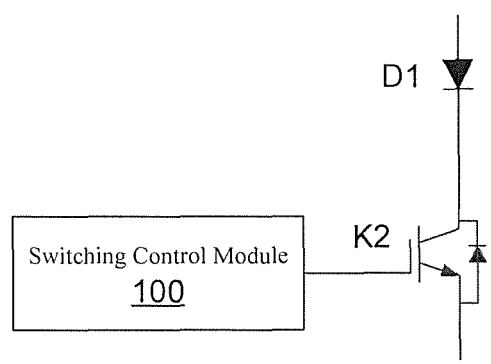
FIG. 10 is a schematic diagram of one embodiment of the one-way switch shown in FIG. 8 and FIG. 9.

Wherein: the one-way switch 3 can be any component that can be used to accomplish ON/OFF control of a one-way circuit. For example, the one-way switch 3 can be in the structure shown in FIG. 10, which is to say, the one-way switch 3 can comprise a one-way semiconductor component D1 and a switch K2 connected in series to each other. The plurality of one-way switches can be implemented with a plurality of one-way semiconductor components and switches connected in series; or, they can be implemented by sharing one switch, for example, a plurality of one-way semiconductor components can be connected at one end to one end of the same switch in series, the one-way semiconductor components can be connected at the other end to a plurality of charge storage components in one-to-one correspondence, and the other end of the switch can be connected to the current storage components, so that the number of switches in the heating circuit can be decreased; or, the plurality of one-way switches can be implemented by sharing one one-way semiconductor component, for example, a plurality of switches can be connected at one end to one end of a one-way semiconductor component, the switches can be connected at the other end to a plurality of charge storage components at one end, and the other end of the one-way semiconductor component can be connected to the current storage components, so that the number of one-way semiconductor components in the heating circuit can be decreased. Certain embodiments of the present invention do not impose any limitation to the specific implementation of the one-way switches for the polarity inversion unit 101 in the heating circuit, as long as the implementation can accomplish the control of the polarity inversion process of the plurality of charge storage components.

Figure 11:
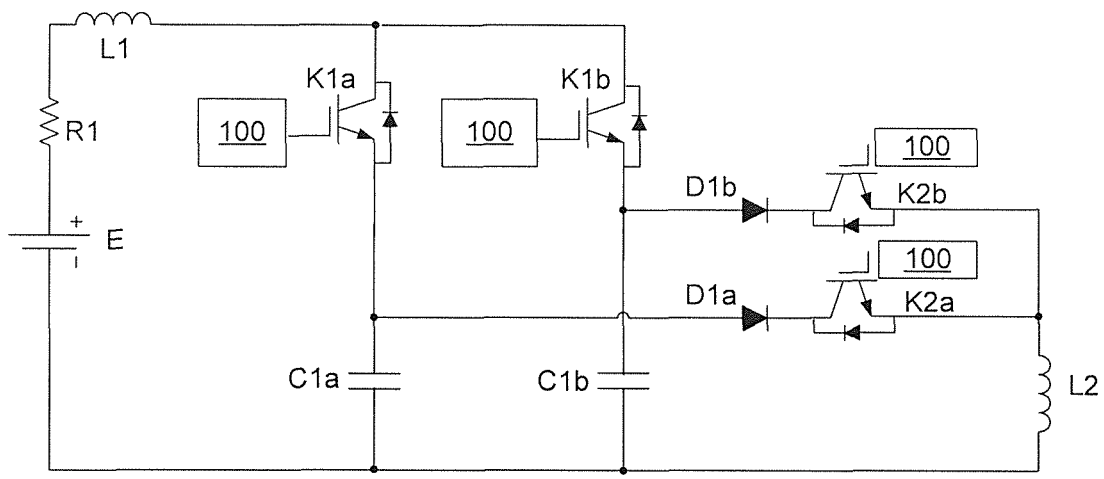
FIG. 11 is a schematic diagram of one embodiment of the battery heating circuit provided in the present invention.
Figure 12:
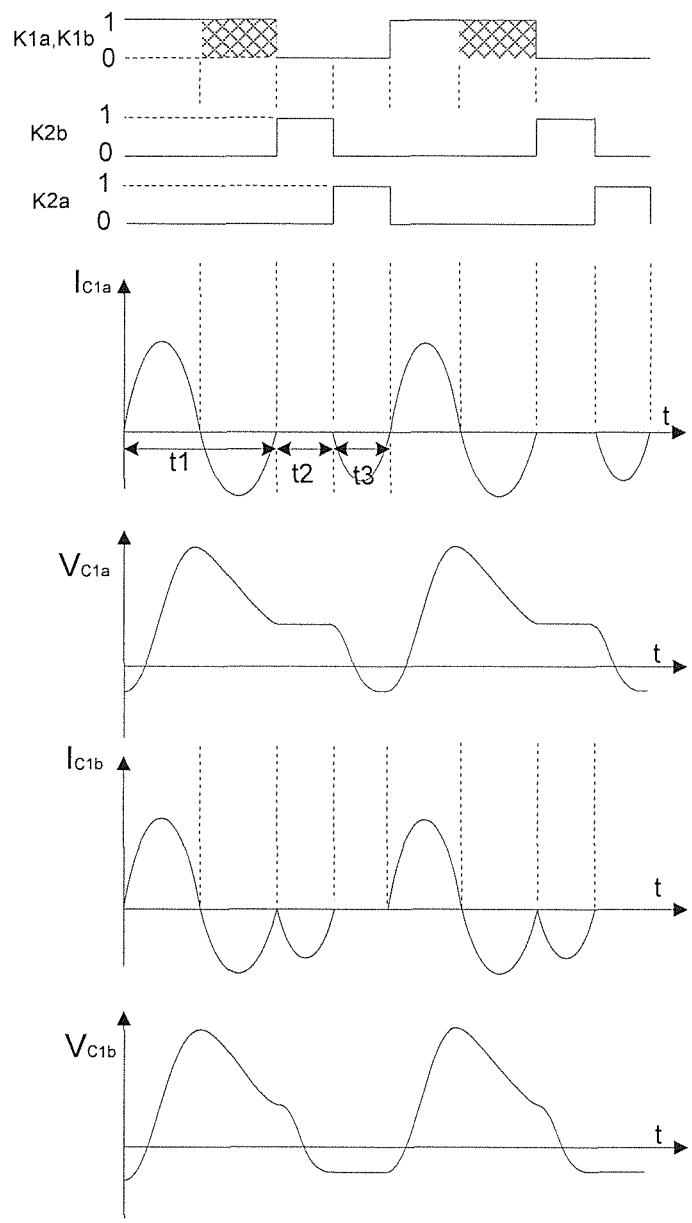
FIG. 12 shows the wave pattern corresponding to the battery heating circuit shown in FIG. 11.
Figure 13:
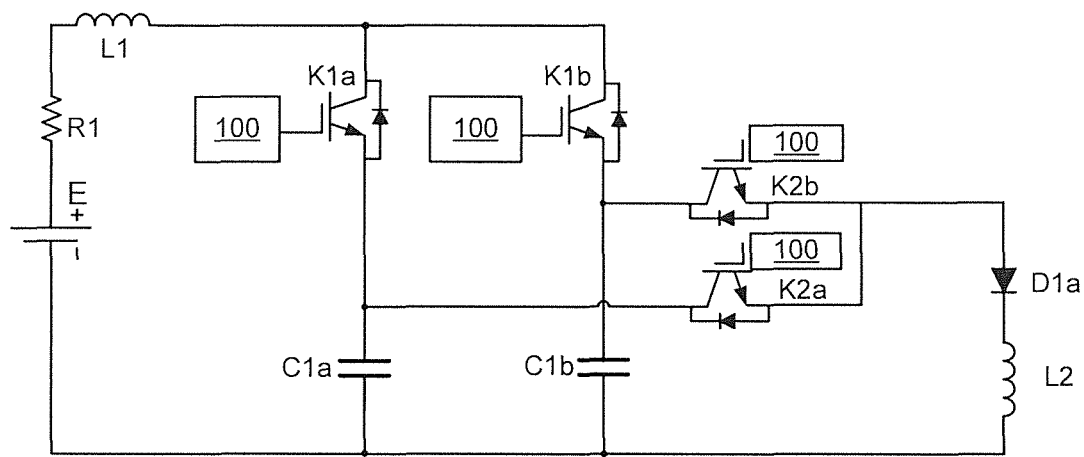
FIG. 13 is a schematic diagram of another embodiment of the battery heating circuit provided in the present invention.
Figure 14:
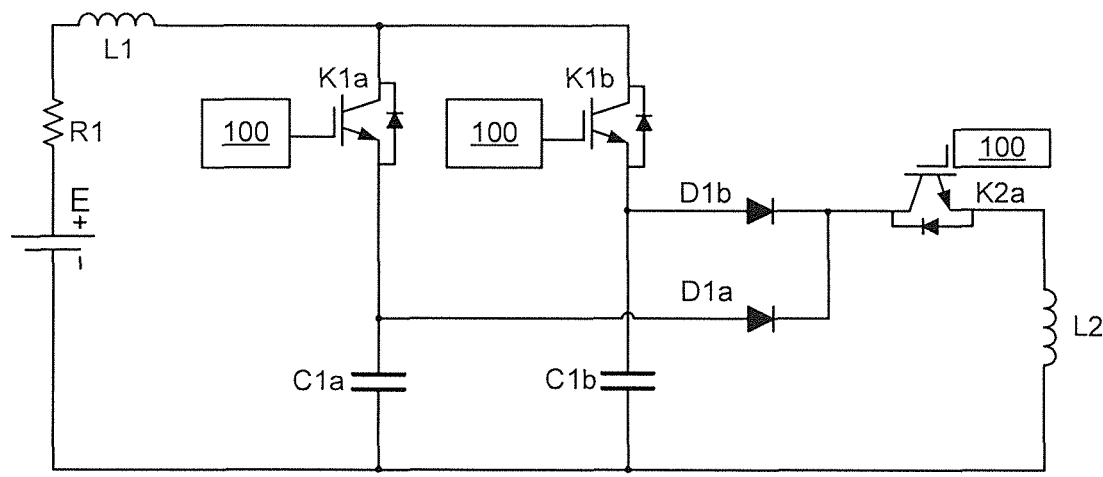
FIG. 14 is a schematic diagram of another embodiment of the battery heating circuit provided in the present invention.

Hereunder the working process of the embodiments of the heating circuit for battery E will be introduced, with reference to the FIG. 11-14, wherein: FIG. 11, FIG. 13, and FIG. 14 show different embodiments of the heating circuit for battery E, and FIG. 12 shows the wave pattern corresponding to the heating circuit for battery E shown in FIG. 11. It should be noted: though the features and components of certain embodiments of the present invention are described specifically with reference to FIGS. 11, 13, and 14, each feature or component can be used separately without other features and components, or can be used in combination or not in combination with other features and components. The embodiments of the heating circuit for battery E provided in the present invention are not limited to those shown in FIGS. 11, 13, and 14. The grid part of the wave pattern shown in FIG. 12 indicates that drive pulses can be applied to the switch in one or more times within the period, and the pulse width can be adjusted as needed.

In the heating circuit for battery E shown in FIG. 11, the switch units 1 are in the form of two-way switches (i.e., two-way switch K1a and K1b); the two-way switch K1a is connected with a charge storage component C1a in series to form a first branch, and the two-way switch K1b is connected with a charge storage component C1b in series to form a second branch; both of the two branches are connected with the current storage component L1, damping component R1, and battery E in series. The polarity inversion units 101 share one current storage component L2; the one-way semiconductor component D1*a* and switch K2*a* as well as the one-way semiconductor component D1*b* and switch K2*b* form two one-way switches 3, respectively, and are configured to control the polarity inversion process of charge storage component C1*a* and C1*b*, respectively. The switching control module can control ON/OFF of K1*a*, K1*b*, K2*a*, and K2*b*. FIG. 12 shows the wave patterns of current IC1*a* through the charge storage component C1*a* and the voltage VC1*a* across the charge storage component C1*a* as well as the current IC1*b* through the charge storage component C1*b* and the voltage VC1*b* across the charge storage component C1*b*; the heating circuit shown in FIG. 11 can operate through the following procedures:

a) The switching control module 100 controls the two-way switch K1*a* and K1*b* to switch on, as indicated by the time period t1 in FIG. 12; thus, the battery E can discharge in forward direction through the loop composed of two-way switch K1*a* and charge storage component C1*a* and the loop composed of two-way switch K1*b* and charge storage component C1*b* (as indicated by the positive half cycles of current IC1*a* and IC1*b* in the time period t1 in FIG. 12), and can be charged in reverse direction (as indicated by the negative half cycles of current IC1*a* and IC1*b* in the time period t1 in FIG. 12);

b) The switching control module 100 controls the two-way switch K1*a* and K1*b* to switch off when the current in reverse direction is zero.

c) The switching control module 100 controls the switch K2*b* to switch on, and thus the charge storage component C1*b* discharges through the loop composed of one-way semiconductor component D1*b*, current storage component L2, and switch K2*b*, and attain the purpose of voltage polarity inversion, and then, the switching control module 100 controls the switch K2*b* to switch off, as indicated by the time period t2 in FIG. 12;

d) The switching control module 100 controls the switch K2*a* to switch on, and thus the charge storage component C1*a* discharges through the loop composed of one-way semiconductor component D1*a*, current storage component L2, and switch K2*a*, and attain the purpose of voltage polarity inversion, and then, the switching control module 100 controls the switch K2*a* to switch off, as indicated by the time period t3 in FIG. 12;

e) The step a) to step d) are repeated; thus, the battery E is heated up continuously in the charge/discharge cycles, till the battery E meets the heating stop condition.

In the heating circuit for battery E shown in FIG. 13, the switch units 1 are still in the form of two-way switches shown in FIG. 11 (i.e., two-way switch K1*a* and K1*b*); the two-way switch K1*a* is connected with a charge storage component C1*a* in series to form a first branch, and the two-way switch K1*b* is connected with a charge storage component C1*b* in series to form a second branch; both of the two branches are connected with the current storage component L1, damping component R1, and battery E in series. The polarity inversion units 101 still share one current storage component L2; however, different to the polarity inversion units shown in FIG. 11, the polarity inversion units in FIG. 13 employ one-way semiconductor component D1*a* and switch K2*a* and switch K2*b* as one-way switches in them, wherein: the switch K2*a* and K2*b* are connected at one end to one end of the one-way semiconductor component D1*a*, and the switch K2*a* and K2*b* are connected at the other end to charge storage component C1*a* and C1*b*, respectively; the other end of the one-way semiconductor component D1*a* is connected to the current storage component L2. The switching control module 100 can control ON/OFF of K1*a*, K1*b*, K2*a*, and K2*b*, so as to control the working process of the entire heating circuit. Compared to the heating circuit shown in FIG. 11, the heating circuit for battery E shown in FIG. 13 is slightly different only in the circuit structure of one-way switches in the polarity inversion units 101, while the operating process is essentially the same. Therefore, it will not be further detailed here.

In the heating circuit for battery E shown in FIG. 14, the switch units 1 are still in the form of two-way switches shown in FIG. 11 (i.e., two-way switch K1*a* and K1*b*); the two-way switch K1*a* is connected with a charge storage component C1*a* in series to form a first branch, and the two-way switch K1*b* is connected with a charge storage component C1*b* in series to form a second branch; both of the two branches are connected with the current storage component L1, damping component R1, and battery E in series. The polarity inversion units 101 still share one current storage component L2; however, different to the polarity inversion units shown in FIG. 11, the polarity inversion units in FIG. 14 employ one-way semiconductor component D1*a*, one-way semiconductor component D1*b*, and switch K2*a* as one-way switches in them, wherein: the one-way semiconductor component D1*a* and one-way semiconductor component D1*b* are connected at one end to one end of the switch K2*a*, the one-way semiconductor component D1*a* and one-way semiconductor component D1*b* are connected at the other end to the charge storage component C1*a* and C1*b*, respectively, and the other end of the switch K2*a* is connected to the current storage component L2. The switching control module 100 can control ON/OFF of K1*a*, K1*b*, K2*a*, and K2*b*, so as to control the working process of the entire heating circuit. When the heating circuit shown in FIG. 14 operates, first, the two-way switch K1*a* can be controlled to switch on, so that the battery E can discharge and be charged through the branch of charge storage component C1; then, the two-way switch K1*a* can be controlled to switch off, and the switch K2*a* can be controlled to switch on, so as to invert the voltage polarity of the charge storage component C1*a*; after the voltage polarity inversion of charge storage component C1 is accomplished, the switch K2*a* can be controlled to switch off; then, the two-way switch K1*b* can be controlled to switch on, so that the battery E can discharged and be charged through the branch of the charge storage component C1*b*; next, the two-way switch K1*b* can be controlled to switch off, and the switch K2*a* can be controlled to switch on, so as to invert the voltage polarity of the charge storage component C1*b*; after the voltage polarity inversion of charge storage component C1*b* is accomplished, the switch K2*a* can be controlled to switch off. The cycles can be repeated, till the condition for stopping battery heating is met.

The heating circuit provided in certain embodiments of the present invention can improve the charge/discharge performance of the battery; in addition, since the energy storage circuit and switch unit are connected with the battery in series in the heating circuit, safety problem related with failures and short circuit of the switch unit can be avoided when the battery is heated owing to the existence of the charge storage component connected in series, and therefore the battery can be protected effectively. In addition, a polarity inversion unit is added in the heating circuit provided in certain embodiments of the present invention; thus, after the switch unit switches off, the polarity inversion unit can invert the voltage polarity of the charge storage components in the energy storage circuit; since the voltage across the charge storage component can be added serially with the voltage of the battery after polarity inversion, the discharging current in the heating circuit can be increased when the switch unit is controlled to switch on at the next time, and thereby the working efficiency of the heating circuit can be improved. Moreover, in embodiments of the present invention, a single inductor is employed to implement polarity inversion; therefore, the number of components can be reduced, and thereby the size and weight of the battery heating circuit can be reduced.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits.

While some embodiments of the present invention are described above with reference to the accompanying drawings, the present invention is not limited to the details of those embodiments. Those skilled in the art can make modifications and variations, without departing from the spirit of the present invention. However, all these modifications and variations shall be deemed as falling into the scope of the present invention.

In addition, it should be noted that the specific technical features described in the above embodiments can be combined in any appropriate way, provided that there is no conflict. To avoid unnecessary repetition, certain possible combinations are not described specifically. Moreover, the different embodiments of the present invention can be combined as needed, as long as the combinations do not deviate from the spirit of the present invention. However, such combinations shall also be deemed as falling into the scope of the present invention.

Hence, although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A heating circuit for a battery, comprising:
a plurality of switch units, a switching control module, a damping component, an energy storage circuit, and a polarity inversion unit, wherein:
the energy storage circuit is connected with the battery, and comprises a first current storage component and a plurality of charge storage components;
the plurality of charge storage components are connected with the plurality of switch units in series in one-to-one correspondence to form a plurality of branches;
the plurality of branches are connected in parallel with each other and connected with the first current storage component and damping component in series;
the switching control module is connected with the switch units, and is configured to control switching on and off of the switch units, so that energy flows back-and-forth between the battery and the energy storage circuit when the switch units switch on;
the polarity inversion unit is connected with the energy storage circuit, and is configured to invert a voltage polarity of the plurality of charge storage components after the switch units switch from on to off.

2. The heating circuit according to claim 1, wherein:
the polarity inversion unit comprises a plurality of inversion circuits;
the plurality of inversion circuits are connected with the plurality of charge storage components in one-to-one correspondence, wherein:
each inversion circuit comprises a one-way switch and the first current storage component connected in series with each other;
the switching control module is also connected with the one-way switches, and is configured to invert the voltage polarity of the plurality of charge storage components by controlling the one-way switches to switch on.

3. The heating circuit according to claim 1, wherein:
the polarity inversion unit comprises a plurality of one-way switches and a second current storage component;
the plurality of one-way switches are connected at one end to the plurality of charge storage components at one end in one-to-one correspondence, the plurality of one-way switches are connected at the other end to one end of the second current storage component, and the other end of the second current storage component is connected to the plurality of charge storage components at the other end;
the switching control module is also connected with the one-way switches, and is configured to invert the voltage polarity of the plurality of charge storage components at the same time or in sequence by controlling the one-way switches to switch on.

4. The heating circuit according to claim 1, wherein: each switch unit is a two-way switch.

5. The heating circuit according to claim 1, wherein:
each switch unit comprises a first one-way branch configured to transfer energy from the battery to the energy storage circuit and a second one-way branch configured to transfer energy from the energy storage circuit to the battery;
the switching control module is connected with either or both of the first one-way branch and second one-way branch, to control switching on and off of the connected branch.

6. The heating circuit according to claim 5, wherein:
each switch unit comprises a first two-way switch and a second two-way switch,
the first two-way switch and the second two-way switch are connected in series opposite to each other to form the first one-way branch and the second one-way branch;
the switching control module is connected with the first two-way switch and the second two-way switch respectively, and is configured to control switching on and off of the first one-way branch and the second one-way branch by controlling switching on and off of the first two-way switch and the second two-way switch.

7. The heating circuit according to claim 5, wherein:
each switch unit comprises a first switch, a first one-way semiconductor component, and a second one-way semiconductor component, the first switch and the first one-way semiconductor component are connected with each other in series to constitute the first one-way branch;
the second one-way semiconductor component constitutes the second one-way branch;
the switching control module is connected with the first switch, and is configured to control switching on and off of the first one-way branch by controlling switching on and off of the first switch.

8. The heating circuit according to claim 7, wherein:
each switch unit further comprises a second switch in the second one-way branch, and the second switch is connected with the second one-way semiconductor component in series;

the switching control module is also connected with the second switch, and is configured to control switching on and off of the second one-way branch by controlling switching on and off of the second switch.

9. The heating circuit according to claim 5, wherein: each switch unit further comprises a resistor connected in series with the first one-way branch and/or the second one-way branch.

10. The heating circuit according to claim 1, wherein: the switching control module controls each switch unit to switch off when or after a current through that switch unit reaches zero after that switch unit switches on.

11. The heating circuit according to claim 1, wherein: the switching control module controls the plurality of switch units, so that the energy can flow from the battery to the charge storage components at the same time or in sequence, and the energy can flow from the charge storage components to the battery at the same time or in sequence.

12. The heating circuit according to claim 1, wherein: the damping component is a parasitic resistance in the battery, and the first current storage component is a parasitic inductance in the battery.

\* \* \* \* \*